(12) United States Patent
Wade et al.

(10) Patent No.: US 6,280,013 B1
(45) Date of Patent: *Aug. 28, 2001

(54) HEAT EXCHANGER FOR AN INKJET PRINTHEAD

(75) Inventors: John M. Wade, Poway; Kenneth J. Courian, San Diego; James L. McCullough, San Diego; Joe R. Pietrzyk, San Diego; Marvin D. Patton, San Diego, all of CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/964,583

(22) Filed: Nov. 5, 1997

(51) Int. Cl.⁷ ............................. B41J 29/38; B41J 29/377
(52) U.S. Cl. ................................................ 347/17; 347/18
(58) Field of Search ............................. 347/17, 18, 223, 347/86; 400/124.13; 165/104.11, 104.19

(56) References Cited

U.S. PATENT DOCUMENTS

| | | | |
|---|---|---|---|
| 4,864,329 | 9/1989 | Kneezel et al. | 346/140 R |
| 5,017,941 | 5/1991 | Drake | 346/1.1 |
| 5,066,964 | * 11/1991 | Fukuda et al. | 347/18 |
| 5,084,713 | 1/1992 | Wong | 346/1.1 |
| 5,121,130 | 6/1992 | Hempel | 346/1.1 |
| 5,124,717 | 6/1992 | Campanelli | 346/1.1 |
| 5,272,491 | 12/1993 | Asakawa et al. | 346/140 R |
| 5,374,944 | 12/1994 | Janosky et al. | 346/76 PH |
| 5,399,265 | 3/1995 | Nehls | 210/490 |
| 5,459,498 | 10/1995 | Seccombe et al. | 347/18 |
| 5,488,401 | * 1/1996 | Mochizuki et al. | 347/86 |
| 5,623,292 | * 4/1997 | Shrivastava et al. | 347/18 |
| 5,657,061 | * 8/1997 | Seccombe et al. | 347/18 |

* cited by examiner

Primary Examiner—Thinh Nguyen
Assistant Examiner—Charles W. Stewart, Jr.

(57) ABSTRACT

Disclosed is an inkjet printhead having a substrate that includes plurality of ink ejection elements formed thereon. The printhead also includes a heat exchanger in thermal contact with the substrate. The heat exchanger has a plurality of pathways for allowing a passage of ink through the heat exchanger.

27 Claims, 5 Drawing Sheets

HEAT EXCHANGER FOR AN INKJET PRINTHEAD

BACKGROUND OF THE INVENTION

The present invention relates to inkjet printing systems, and more particularly, inkjet printing systems which make use of cooling methods to allow an inkjet printhead to operate at very high throughput rates.

Inkjet printing systems frequently make use of an inkjet printhead mounted to a carriage which is moved back and forth across a print media, such as paper. As the printhead is moved across the print media, a control system activates the printhead to deposit ink droplets onto the print media to form images and text. More specifically, ink ejection chambers formed in the printhead eject droplets of ink in a dot matrix pattern. These droplets are ejected by energizing ink ejection elements.

When inkjet printing systems are designed for very high ink flow rate printing, such as those printers for printing large format images, the ink ejection elements generate large amounts of heat. This heat can increase the temperature of the printhead substrate to the point of causing print defects. As the printhead substrate temperature approaches the boiling point of ink, the printhead will cease operating and may sustain permanent damage.

One way to mitigate this problem is to slow down printing when the printhead substrate reaches a critical temperature level. Typically, the printhead will have a thermal sense resistor or equivalent to allow the printing system to monitor substrate temperature. However, slowing down printing is not a "solution"; rather it is a constraint that the present invention is intended to eliminate or minimize.

Accordingly, there is a need to enhance the cooling efficiency of a printhead. Considerations also include the efficiency of printhead assembly, particulate controls during assembly and printhead operation, and air accumulation.

SUMMARY OF THE INVENTION

The present invention is an inkjet printhead having a substrate that includes plurality of ink ejection elements formed thereon. The printhead also includes a heat exchanger in thermal contact with the substrate. The heat exchanger has a plurality of pathways for allowing a passage of ink through the heat exchanger.

DETAILED DESCRIPTION OF THE PREFERRED EMBODIMENT

Although this invention is described with respect to an off-axis or off-carriage printing system, wherein the replaceable ink container is separate from the printhead, it is equally applicable to systems using disposable printheads, wherein each ink container is integral to a printhead. This invention is also applicable to systems wherein the printhead is replaceable or to systems wherein the printhead is a permanent part of the printing system. This invention is applicable to a wide range of printing systems, including large format devices, copiers, and multifunction devices.

Figure 1:
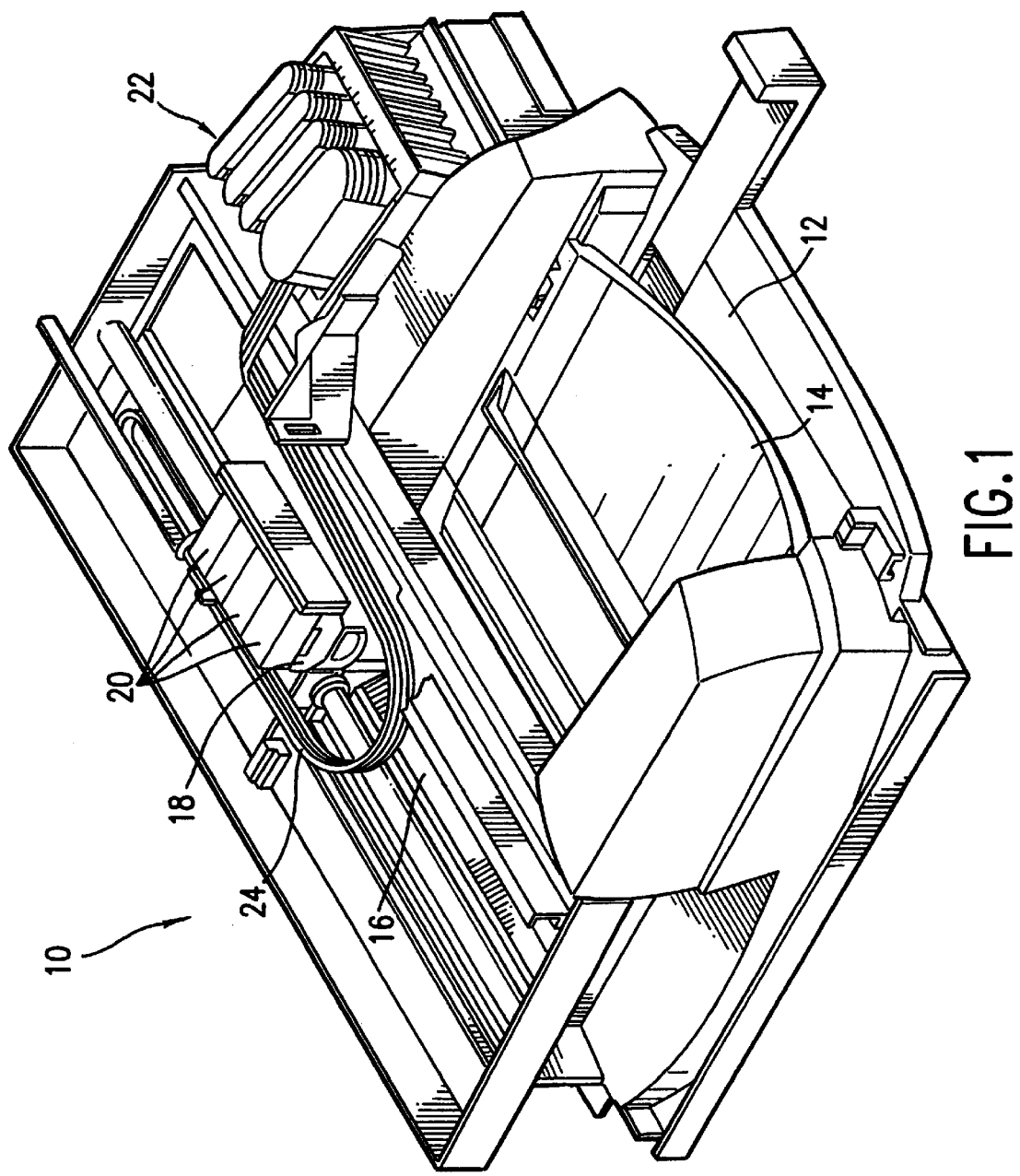
FIG. 1 is a perspective view of a printing system utilizing the present invention.

FIG. 1 illustrates an exemplary high speed printing system or printer 10 that incorporates the invention. A tray 12 holds a supply of input paper or other print media. When a printing operation is initiated, a sheet of paper is fed into printer 10 and is then brought around in a U-shaped path towards an output tray 14. The sheet is then stopped in a print zone 16, and a scanning carriage 18, containing plural print cartridges 20 is scanned across the sheet for printing a swath of ink thereon. The process repeats until the entire sheet has been printed, at which point it is ejected into output tray 14. Print cartridges 20 may be removeably mountable or permanently mounted to scanning carriage 18.

Print cartridges 20 are each fluidically coupled to one of a plurality of removable ink containers 22 via a flexible conduit 24. Because the replaceable ink containers 22 are situated in a stationary location off of carriage 18, this printing system is referred to as having an off-carriage ink delivery system. Print cartridges 20 are also electrically coupled to printer 10, such that printer 10 can provide energization signals to enable print cartridges 20 to selectively deposit ink on media.

Figure 2:
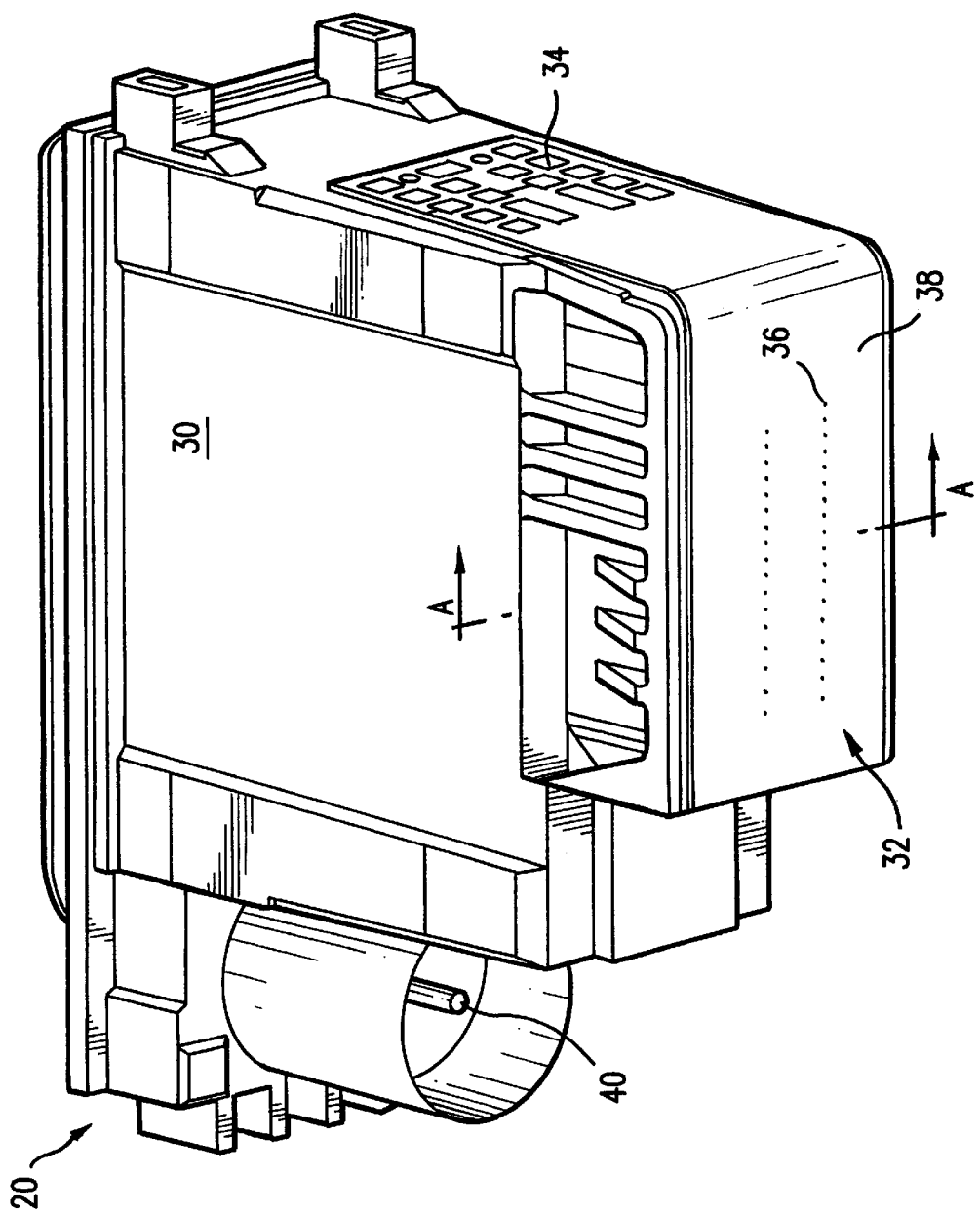
FIG. 2 is a perspective view of a print cartridge utilizing the invention.

This invention concerns a thermal rise that occurs in a printhead 32 (refer to FIG. 2). As printhead 32 is energized, ink ejection elements generate heat to eject ink, and printhead 32 experiences an increase in temperature. At a critical level, this temperature can cause print defects or even damage to printhead 32. One aspect of this invention is a means of reducing this thermal rise in printhead 32.

Referring to FIGS. 1 and 2, shown is an exemplary print cartridge 20 that incorporates the invention. Print cartridge 20 includes housing 30 to which a printhead 32 is affixed. Printhead 32 receives energization signals from contacts 34 to drive ink ejection elements (not shown) that are located proximate to ink orifices 36 that are formed in an orifice member 38 so that ink droplets can be ejected from ink orifices 36. Ink is channeled from a disposable ink container 22, through flexible conduit 24, into ink inlet 40, through housing 30, and to printhead 32. Between ink inlet 40 and the printhead 32, housing 30 typically has a filter element through which ink must pass before reaching printhead 32 to remove particulates that may clog ink orifices 36 or otherwise interfere with proper ejection of ink droplets.

Figure 3:
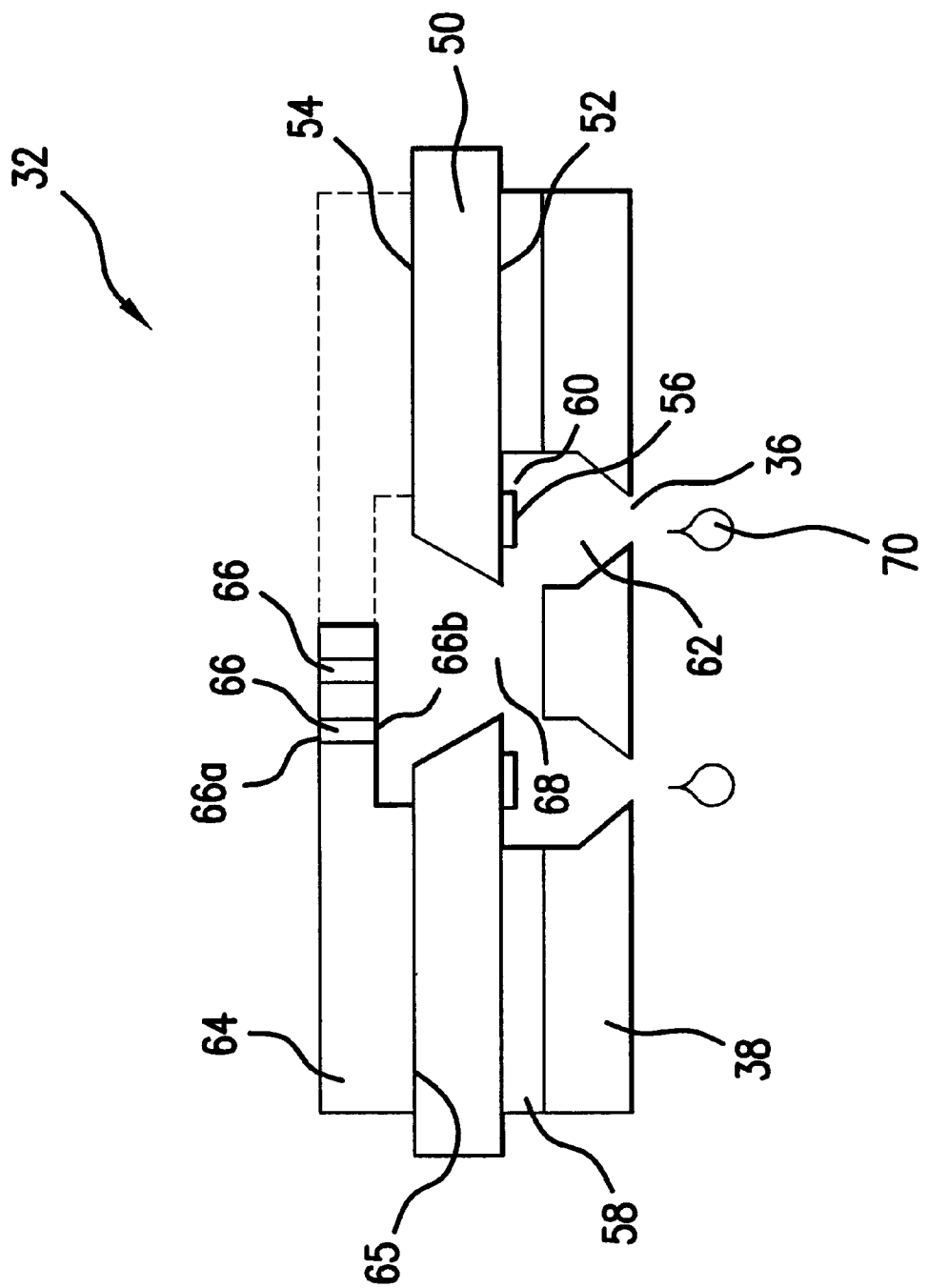
FIG. 3 is a cross-sectional taken through AA of FIG. 2 showing only the printhead for a center feed design.

Referring to FIG. 3, shown is a cross-section of print cartridge 20 along AA of FIG. 2, with only printhead 32 included to illustrate the invention. Printhead 32 includes a substrate 50 having a front surface 52 and an opposing back surface 54. The front surface 52 of substrate 50 has a plurality of ink ejection elements or drop ejection elements or heater resistors 56 formed thereon. Attached to the front surface 52 of the substrate 50 is an ink barrier layer 58 that forms channels 60 that direct ink to ink ejection elements 56. Overlying the ink barrier layer 58 is orifice member 38 that includes a plurality of nozzles or orifices 36 formed therein. Each ink ejection element 56 has an associated channel 60 and orifice 36 to form an ink ejection chamber 62.

In thermal contact with the back surface of substrate 50 is a heat exchanger 64. Heat exchanger 64 is preferably formed of a material having high thermal conductivity. The bulk conductivity of the heat exchanger material is preferably above about 10 W/mK (watts per meter degree kelvin). For maximum cooling, the conductivity would be above about 100 W/mK. Materials may include both metals and dielectrics. Acceptable materials, depending on the degree of cooling required, include monel, bronze (52 W\mK), gold (300 W/mk), stainless steel (13.4 W/mK), alumina, and silicon (148 W\mK).

Formed in heat exchanger 64 is a plurality of pathways 66; each pathway 66 defines an inlet 66a and an outlet 66b. Each inlet 66a is in fluid communication with a source of ink (not shown); each outlet 66b is in fluid communication with ink ejection chambers 62. Pathways 66 can be formed in any number of ways, including laser drilling or etching. Alternatively, heat exchanger 64 is a porous substance as will be discussed further with respect to FIGS. 4 and 5. When heat exchanger 64 is porous, pathways 66 are provided by the connections between the pores.

Figure 4:
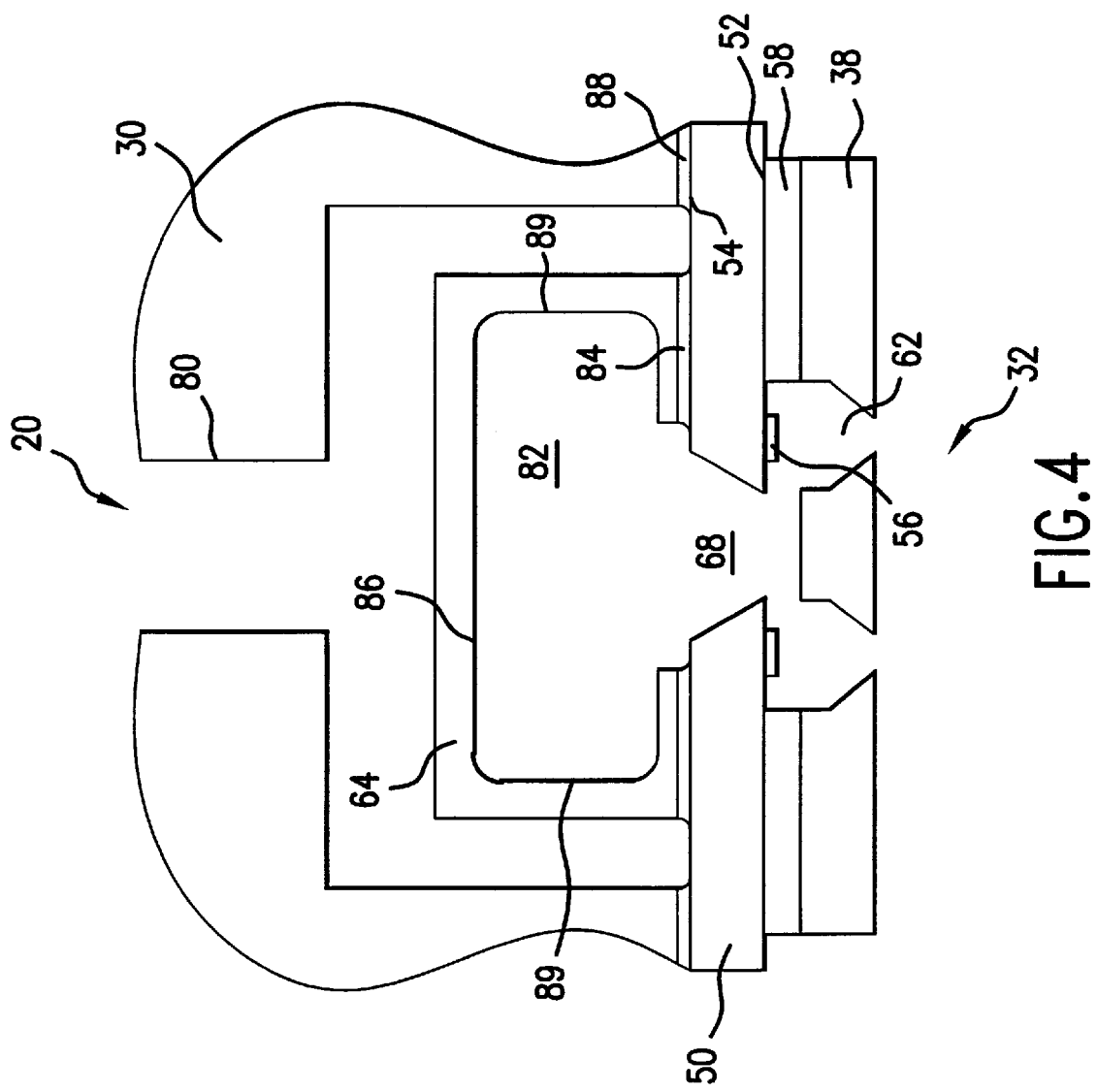
FIG. 4 is a cross-sectional view taken through AA of FIG. 2 wherein the printhead is a center feed design.

Heat exchanger 64 is preferably affixed to substrate 50 using a thermally conductive material (shown in FIG. 4). However, thermal contact can be provided by maintaining a pressure contact between heat exchanger 64 and substrate 50. Alternatively, thermal contact can be provided by holding heat exchanger 64 and substrate 50 in fixed relation with a thermally conductive substance therebetween. Even with a thermally conductive substance between heat exchanger 64 and substrate 50, the distance between them should typically be minimized. The distance would preferably be below about 2 millimeters, with a distance below about 0.1 millimeters more preferable. The required distance would be dependent upon the intervening material properties. The assembly of printhead 32 will be discussed with respect to FIG. 4.

In operation, ink flows from an ink source (not shown), through pathways 66, through ink feed slot 68 in substrate 50, and into ink ejection chambers 62. Energization signals are provided to activate ink ejection elements 56 causing ink droplets 70 to be ejected onto media. During the operation of printhead 32, ink ejection elements 56 generate heat that raises the temperature of substrate 50. It is known that the drop ejection characteristics of a printhead change as the substrate and ink associated with the printhead rise in temperature. For example, the drop volume of the ejected droplets 70 increases with temperature of the substrate 50. For very high speed printing systems, such as high speed printers, color copiers, and large format devices, this thermal rise can cause unacceptable print artifacts.

The present invention provides an improved printhead design for controlling the temperature of printhead 32. As ink ejection elements 56 operate, heat flows from substrate 50 to heat exchanger 64 via conduction. Then, heat flows from heat exchanger 64 and into the ink via forced convection as ink flows through the plural pathways 66. Thus, the present invention provides an efficient means of cooling substrate 50 during operation of printhead 32.

In a preferred embodiment, heat exchanger 64 extends completely across the slot 68 (see dashed line) leading toward ink ejection chambers 62 such that essentially all ink ejected from ink ejection chambers 62 must pass through pathways 66 beforehand. This provides efficient forced convection. Decreasing the size and increasing the number of pathways 66 further increases the contact area between heat exchanger 64 and the ink; this further improves the efficiency of thermal convection between heat exchanger 64 and the ink passing therethrough. Note, however, that if the pathways consume an appreciable enough volume of heat exchanger 64, the thermal conduction mechanism of heat exchanger 64 will be impaired. When the pathways 66 are small enough, heat exchanger 64 can also act as a filtration element.

Figure 5:
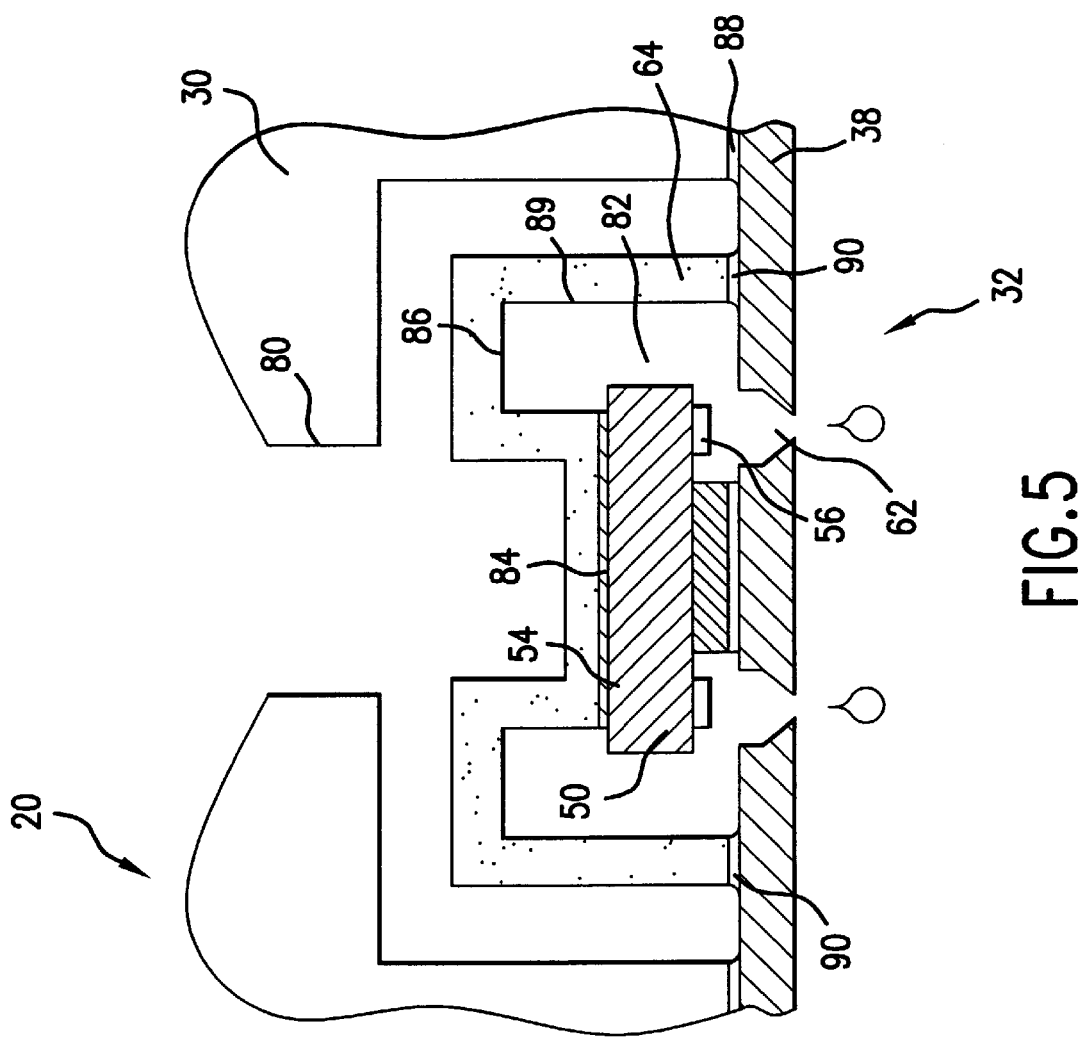
FIG. 5 is a cross-sectional view taken through AA of FIG. 2 wherein the printhead is an edge feed design.

FIGS. 4 and 5 illustrate preferred embodiments for center and edge feed configurations of cross section AA from FIG. 2. The version shown in FIG. 4 is referred to as center feed, since ink flows through inner slot 68 of substrate 50 to reach ink ejection chambers 62 during a printing operation. In contrast, the version shown in FIG. 5 is referred to as edge feed, since ink flows around the edge of substrate 50 to each ink ejection chambers 62 during a printing operation.

In thermal contact with the back surface 54 of substrate 50 is a heat exchanger 64. Heat exchanger 64 extends a distance from the back surface 54 of substrate 50 to form a chamber 82 (two chambers for edge feed in FIG. 5). In this preferred embodiment, heat exchanger 64 is fabricated from a porous conductive material. Therefore, connections between the pores internal to the material of heat exchanger 64 provide the pathways 66 as illustrated with respect to FIG. 3. A number of materials are suitable for heat exchanger 64, including porous ceramics.

In a preferred embodiment, heat exchanger 64 is fabricated from sintered metal. A number of metals exist that would work for various applications, including stainless steel, bronze, or gold plated bronze. In an exemplary embodiment, heat exchanger 64 is fabricated from a sintered Monel to provide high thermal conductivity while still having good chemical resistance to inks.

As indicated earlier, heat exchanger 64 is in thermal contact with the back surface 54 substrate 50. This thermal contact must provide a low enough resistance to thermal conduction to allow effective conductive heat transfer. In a preferred embodiment, a thermally conductive material 84 is provided between the back surface 54 and heat exchanger 64. Conductive material 84 is preferably a thermally conductive adhesive that affixes heat exchanger 64 to substrate 50.

Alternatively, conductive material 84 could be a non-adhesive material, such as thermally conductive gel. In that case, a separate fastening method can be used to provide a rigid relationship between substrate 50 and heat exchanger 64. For example, a separate adhesive could be used to provide mechanical fastening between substrate 50 and heat exchanger 64. Thus, one embodiment of this invention would be a thermally conductive, but non-adhesive compound combined with a separate adhesive.

A supply of ink is fluidically connected to printhead 32 via conduit 80 formed in housing 30. The supply of ink can be internal to print cartridge 20 or a remote ink container 22 as discussed with respect to FIG. 1. Printhead 32 is rigidly affixed to housing 30 via adhesive 88. Thus, housing 30 provides a structure for supporting printhead 32 and fluidic connection of printhead 32 to a source of ink (not shown).

To fabricate the center feed version (FIG. 4) of print cartridge 20, printhead 32 is first assembled (without the heat exchanger) using techniques known in the art. This assembly process is not illustrated, but is briefly described as follows. First, circuitry and heater elements 56 are formed on a silicon wafer. Second, ink barrier layer 58 is formed on the wafer. Third, a substrate 50 is singulated from the silicon wafer. At this point, orifice member 38 is attached. Alternatively, orifice member 38 can be attached while substrate 18 is still in wafer form prior to singulation.

After the aforementioned assembly, thermally conductive adhesive 84 is dispensed on heat exchanger 64 or substrate 50 using conventional adhesive dispensing techniques. Heat exchanger 64 is then aligned with respect to substrate 50 and the adhesive is cured, using conventional precision alignment and adhesive curing techniques. Finally, using conventional techniques printhead 32 with the heat exchanger 64 is adhesively attached to housing 30 using adhesive 88 to form print cartridge 20.

For the edge feed version (FIG. 5), the assembly of print cartridge 20 begins with the assembly of printhead 32 without the heat exchanger 64. This method of assembly is, known in the art, and is described in U.S. Pat. No. 5,278,584, entitled "Ink Delivery System for an Inkjet Printhead", which is hereby incorporated by reference.

When printhead 32 is assembled (without the heat exchanger), thermally conductive adhesive 84 is dispensed on heat exchanger 64 and/or substrate 50 using conventional techniques. Additionally, adhesive 90 is dispensed on heat exchanger 64 and/or orifice member 38 using conventional techniques. The printhead (without heat exchanger) and the heat exchanger are aligned with respect to one another and the adhesive(s) are then cured, using conventional techniques. Finally, using conventional techniques printhead 32 with the heat exchanger 64 is adhesively attached to housing 30 using adhesive 88 to form print cartridge 20.

Either method (center or edge feed) has a significant cost and quality advantage because printhead 32 is protected from particulates. When printhead 32 is assembled, and when the heat exchanger 64 is attached, this is done inside of a clean room (such as the relatively particulate-free room of a semiconductor facility). With the assembly of a conventional print cartridge, the additional steps associated with attaching printhead 32 (without heat exchanger 64) require clean room protection until printhead 32 is attached to housing 30. In addition, housing 30 needs to be cleaned until free of particulates between the filter and the region of attachment of printhead 32 prior to attachment of print head 32 to housing 30. In contrast, attaching heat exchanger 64 first eliminates the need for cleaning housing 30 and eliminates the need for additional clean room assembly assuming that heat exchanger 64 can provide sufficient filtration, as discussed below. This is potentially a significant advantage for yield rate (percentage print cartridges built that are fully functional) and cost of assembly.

For the edge feed assembly of FIG. 5, there is an additional benefit. Heat exchanger 64 provides a very stable bonding surface for supporting nozzle member 38 and substrate 50. By matching the thermal expansion coefficient of the heat exchanger 64 to the orifice member 38, thermally induced stresses that would tend to damage printhead 32 are reduced or eliminated.

During operation of printhead 32, heat is generated by ink ejection elements 56 as previously described. Heat is conducted between substrate 50 to heat exchanger 64. Then the heat is transferred from heat exchanger 64 to the ink by forced convection. The convection is forced, since ink is flowing through porous heat exchanger 64 in order to reach drop ejection chambers 62.

In a preferred embodiment, all fluid passing from conduit 80 to drop ejection chambers 62 must pass through heat exchanger 64. If the pore size of heat exchanger 64 is small enough, then heat exchanger 64 eliminates the need for a separate filter element. The required size range of particulates to be filtered depends upon the size of drop ejection chambers 52. For some printheads, this requires that particulates larger than 50 microns be removed. However, some printheads cannot tolerate particulates as small as 25 or even 10 microns. One significant advantage of using a porous filter is the tortuousity (degree of bends and variation in diameter) of the fluid flow paths through the filter. This tends to remove long thin particulates that might pass through a conventional filter only to interfere with the operation of drop ejection chamber 62.

With most inkjet inks, the solubility of air decreases as the temperature is raised. This will cause air bubbles to form and grow on surfaces in chambers 82. At a certain size, they will dislodge from these surfaces and drift upward. At a critical level of accumulation, these bubbles can restrict the flow of ink to drop ejection chambers 62. Thus, chamber 82 needs to be sized sufficiently to allow a level of accumulation of air that is consistent with the printhead life goals of printhead 32. Depending on ink chemistry and printhead use rate, the volume of chamber(s) 82 will vary. For a moderate use rate printer using an ink with a relatively high outgas rate, the chamber(s) need to have a total volume of at least 0.50 cubic centimeters. However, for high use rate printing systems using the same ink, such as copiers and large format devices, the total volume should be at least 1 or 2 cubic centimeters.

When print cartridge 20 is installed in a typical inkjet printer, the back surface 54 of substrate 50 is in a substantially upward facing orientation relative to a gravitational reference. In this case, heat exchanger 64 extends from the back surface 54 in an upward direction. In this case, bubbles will tend to accumulate along an upper surface 86 of heat exchanger 64. At some point, these bubbles may restrict flow through the upper surface 86. However, ink still has flow paths through lateral surfaces 89 of heat exchanger 64 until region 82 is substantially filled with accumulated air. This is a significant advantage of using heat exchanger 64 as a filter element over a more conventional horizontal filter element. With a horizontal filter element, a printhead can become flow restricted as soon as a layer of bubbles forms along the filter element. Thus, the printhead utilizing the present invention has a potentially longer printhead life related to bubble accumulation than a comparable conventional printhead using a horizontal filter element.

What is claimed is:

1. An inkjet printhead, comprising:
   a substrate having a plurality of ink ejection elements formed thereon; and
   a heat exchanger in thermal contact with the substrate, the heat exchanger having a plurality of pathways formed through the heat exchanger, wherein ink passes through the plurality of pathways and directly to the substrate.

2. The printhead of claim 1, wherein the substrate further includes a front surface and an opposing back surface, the ink ejection elements being formed on the front surface and the heat exchanger being in thermal contact with the back surface.

3. The printhead of claim 1, further including a layer of thermally conductive material providing a thermal conduction path between the substrate and heat exchanger.

4. The printhead of claim 3, wherein a thickness of the layer of thermally conductive material is less than 2 millimeters.

5. The printhead of claim 4, wherein the thickness is less than 0.1 millimeters.

6. The printhead of claim 3, wherein the thermally conductive material is an adhesive.

7. The printhead of claim 1, wherein the thermal contact is provided by maintaining contact between a surface of the substrate and a surface of the heat exchanger.

8. The printhead of claim 1, wherein substantially all of the ink reaching the ink ejection elements passes through the heat exchanger.

9. The printhead of claim 1, wherein the heat exchanger and the substrate define a bubble accumulation chamber therebetween.

10. The printhead of claim 9, wherein the heat exchanger includes pathways that allow a flow of ink even when bubbles have accumulated along an upper surface of the bubble accumulation chamber.

11. The printhead of claim 1, wherein the heat exchanger is a porous substance.

12. An inkjet printhead, comprising:
a substrate having plurality of ink ejection elements formed thereon; and
a heat exchanger in thermal contact with the substrate, the heat exchanger being formed from a porous material for allowing ink to flow through the heat exchanger and then directly to the substrate.

13. The printhead of claim 12, wherein substantially all ink ejected by the ink ejection elements flows through the heat exchanger.

14. The printhead of claim 12, wherein the porous material is a sintered metal.

15. An inkjet printing system, comprising:
a printhead including:
a substrate having plurality of drop ejection elements formed thereon;
a heat exchanger in thermal contact with the substrate, the heat exchanger defining a plurality of pathways formed through the heat exchanger for allowing passage of ink through the pathways;
a scanning carriage supporting the printhead over a media print zone; and
a source of ink fluidically connected to the printhead.

16. The printing system of claim 15 wherein the heat exchanger is formed from a porous material.

17. A method for assembling an inkjet print cartridge, comprising:
providing a substrate having first and second surfaces, the first surface having a plurality of ink ejection chambers formed thereon;
providing a housing having a conduit;
attaching a heat exchanger to the second surface of the substrate, wherein the heat exchanger has plural pathways formed through the heat exchanger, and wherein ink passes through the pathways and directly to the substrate; and
affixing the substrate and the heat exchanger to the housing.

18. The method of claim 17, wherein the heat exchanger contains a plurality of pathways that provide fluidic communication between the conduit and the ink ejection chambers.

19. The method of claim 17, wherein the heat exchanger is a material having a degree of porosity to provide the pathways.

20. The method of claim 17, wherein the substrate and the heat exchanger are sealed with respect to the conduit such that the plurality of pathways provides substantially the only fluid path between the conduit and the ink ejection chambers.

21. The method of claim 17, wherein when the heat exchanger is positioned with respect to the back surface of the substrate with a thermally conductive material therebetween.

22. A method of printing comprising the steps of:
providing a scanning carriage supporting an inkjet printhead, the printhead including a substrate in thermal contact with a heat exchanger, the substrate having a plurality of ink ejection chambers and the heat exchanger having a plurality of pathways formed through the heat exchanger for allowing passage of ink through the pathways and directly to the substrate;
supplying ink to the plurality of pathways and allowing ink to flow through the heat exchanger and then directly in to the ink ejection chambers; and
scanning the carriage across a media print zone while providing energization signals to the printhead so that the ink ejection chambers eject droplets of ink.

23. The method printing of claim 22, wherein during the supplying step, substantially all of the supplied ink passes through the plurality of pathways before reaching the ink ejection chambers.

24. The method of printing of claim 22, wherein during the supplying step, the plurality of pathways filters particles from the ink that are large enough to occlude the ink ejection chambers.

25. The method of printing of claim 22, wherein during the supplying step, particles with dimensions of 50 microns are filtered from the ink.

26. The method of printing of claim 22, wherein during the supplying step, particles with dimensions of 25 microns are filtered from the ink.

27. The method of printing of claim 22, wherein the heat exchanger is formed from a porous material.

* * * * *